(12) United States Patent
Ohnhauser et al.

(10) Patent No.: US 7,773,024 B2
(45) Date of Patent: Aug. 10, 2010

(54) SAR ANALOG-TO-DIGITAL CONVERTER WITH LARGE INPUT RANGE

(75) Inventors: Frank Ohnhauser, Stein (DE); Andreas Wickmann, Nuremberg (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/173,283

(22) Filed: Jul. 15, 2008

(65) Prior Publication Data

US 2009/0027251 A1 Jan. 29, 2009

Related U.S. Application Data

(60) Provisional application No. 61/016,740, filed on Dec. 26, 2007.

(30) Foreign Application Priority Data

Jul. 19, 2007 (DE) .................. 10 2007 033 689

(51) Int. Cl.
*H03M 1/12* (2006.01)
(52) U.S. Cl. .................. 341/172; 341/156; 341/155
(58) Field of Classification Search .................. 341/172, 341/155, 156

See application file for complete search history.

(56) References Cited

U.S. PATENT DOCUMENTS

| 6,720,903 | B2 | 4/2004 | Confalonieri et al. |
| 6,940,445 | B2 | 9/2005 | Kearney |
| 7,015,841 | B2 | 3/2006 | Yoshida et al. |
| 7,023,372 | B1* | 4/2006 | Singh et al. .................. 341/155 |
| 7,233,273 | B2* | 6/2007 | Tachibana et al. ............ 341/155 |
| 2004/0075601 | A1* | 4/2004 | Carreau et al. ............... 341/172 |
| 2007/0001890 | A1 | 1/2007 | Piasecki et al. |
| 2007/0035434 | A1 | 2/2007 | Tachibana et al. |
| 2007/0139243 | A1* | 6/2007 | Chowdhury et al. ........ 341/155 |

* cited by examiner

*Primary Examiner*—Jean B. Jeanglaude
(74) *Attorney, Agent, or Firm*—John J. Patti; Wade J. Brady, III; Frederick J. Telecky, Jr (57) ABSTRACT

A method for analog-to-digital conversion is provided using successive approximation and a plurality of capacitors including a first set of capacitors and a second set of capacitors, a first side of each of the plurality of capacitors being coupled to a common node. The method includes sampling an input voltage on the first set of capacitors, after the step of sampling leaving a side of at least one capacitor of the first set of capacitors floating, coupling a capacitor of the first set of capacitors, which is not floating, with a capacitor of the second set of capacitors so as to redistribute the charge on the coupled capacitors, comparing the voltage on the common node with a comparator reference voltage level to receive a comparison result to be used for a bit decision, and switching the floating side of the floating capacitor of the first set of capacitors to either a first reference voltage or a second reference voltage in accordance with the bit decision.

7 Claims, 5 Drawing Sheets

SAR ANALOG-TO-DIGITAL CONVERTER WITH LARGE INPUT RANGE

This patent application claims priority from German Patent Application No. 10 2007 033 689.8, filed 19 Jul. 2007, and from U.S. Provisional Patent Application No. 61/016,740, filed 26 Dec. 2007, the entireties of which are incorporated herein by reference.

FIELD OF THE INVENTION

The invention relates to a method and apparatus for analog-to-digital conversion using successive approximation; and, more specifically, to successive approximation register (SAR) analog-to-digital conversion by use of charge redistribution on a plurality of capacitors.

BACKGROUND

Figures 1, 4:
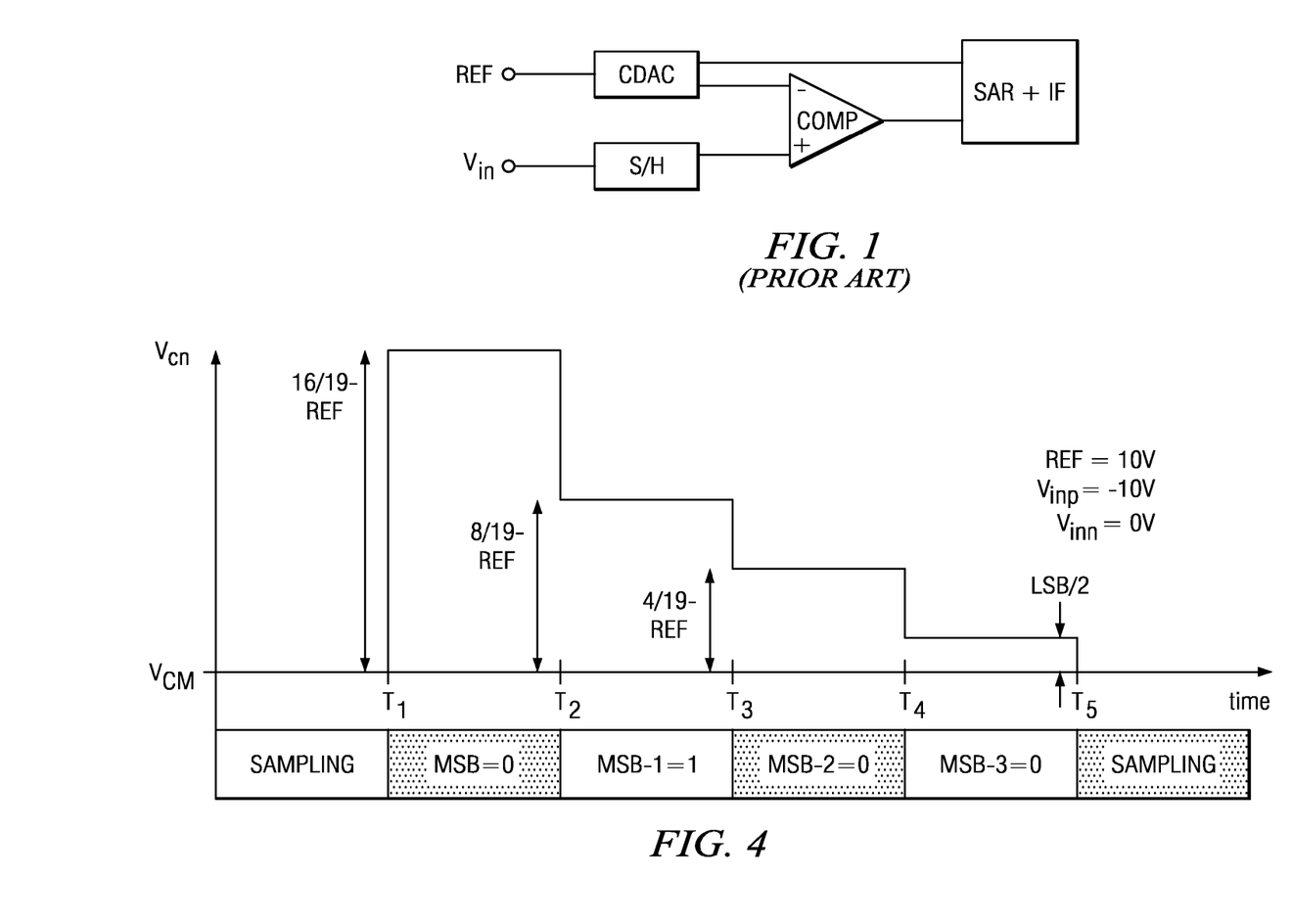
FIG. 1 (Prior Art) shows a block diagram of an SAR analog-to-digital converter according to the prior art.
FIG. 4 shows a diagram illustrating the decrease of required input voltage range dependant on the performed decisions.

Successive approximation is one of the basic principles for analog-to-digital conversion. The general functionality and operation of SAR analog-to-digital converters (ADCs) is well known in the art. Generally, SAR ADCs compare the analog input voltage to reference voltage levels, which can be generated by a digital-to-analog converter (DAC). During a first clock cycle, the sampled input voltage is compared to half the reference voltage output by the DAC. If the input voltage is greater than half the reference voltage, then a respective bit decision relating to the most significant bit (MSB) is made. During the next clock cycle, the input voltage is compared to three quarters or one quarter of the reference voltage in accordance with the preceding MSB decision, and a further bit decision is made relating to the next less significant bit (MSB-1). The conversion procedure carries on accordingly, and the DAC output voltage converges successively to the analog input voltage, while evaluating one bit during each clock cycle. A corresponding block diagram is shown in FIG. 1. The SAR ADC is arranged such that, when the conversion is completed, the digital number input to the DAC represents the digitized input voltage.

Since precise DAC voltages are needed, capacitive DACs (CDACs) are often used, which include a plurality of capacitors. The analog input voltage can be sampled directly on the capacitors of the CDAC, such that a charge corresponding to the size of the capacitors and proportional to the amplitude of the input voltage is present on the sampling capacitors. The sampled charge is redistributed stepwise among the capacitors of the CDAC. The capacitors are connected together on one side to a common node. The magnitude of the input voltage is basically determined by selectively and consecutively switching the other sides of the capacitors between different reference voltage levels and comparing the established voltage level on the common node to a mid voltage level. The capacitor having the largest capacitance will be the first to be connected to a specific reference voltage level, while the remaining capacitors are connected to another reference voltage level. Then the voltage on the common node, which is connected to a comparator input is compared with the mid voltage level, such that the output of the comparator represents the bit values of the digital output word bit by bit, starting with the most significant bit (MSB). In accordance with the comparator output (i.e., the comparison result), the capacitors are consecutively connected one-by-one to either the first or the second reference voltage level and remain in this position during the next conversion steps. The intermediate results are stored in a register.

Up-to-date electronic devices, and corresponding semiconductor manufacturing processes, typically use supply voltages of 5 V or less in order to save power and to gain speed. The supply voltage limits the input signal range of the ADCs. In order to convert a +/−10 V input signal, which is a typical industrial standard, the signal is divided either with a resistive divider or with a capacitive divider, so as to fit the input signal voltage range into the comparator's input voltage range, which is basically between ground and the supply voltage level. However, the division of the input signal decreases the signal-to-noise ratio (SNR). The least significant bit (LSB) for a 5 V supply voltage range and an input range of +/−10 V (i.e., a division by 4 is required) on a 16-bit converter corresponds to 76 PV, although it could amount to 305 µV if the signal was not divided. A typical up-to-date 16-bit SAR converter has a noise level that corresponds to 2 to 6 LSB at the output for any DC input voltage. In order to handle the relatively large input voltage range, high-voltage transistors are required. Typical 5 V semiconductor manufacturing processes provide high-voltage transistors so that ADCs are available that have a high input voltage range even on a low voltage core that runs, for example, with the 5 V supply voltage. However, dividing the input signal is always necessary, thereby decreasing the achievable SNR.

SUMMARY

It is an object of the invention to provide a method and apparatus for analog-to-digital conversion using successive approximation by use of a plurality of capacitors with an increased signal-to-noise ratio.

In one aspect of the invention, a method is provided for analog-to-digital conversion using successive approximation. The method uses a plurality of capacitors comprising a first set of capacitors and a second set of capacitors, with a first side of each of the plurality of capacitors being coupled to a common node. The method includes a step of sampling an input voltage on the first set of capacitors and after having sampled the input voltage, leaving a side of at least one capacitor of the first set of capacitors floating. A capacitor of the first set of capacitors, which is not floating, is switched with its second side to a first reference voltage or a second reference voltage so as to redistribute (through the common node) the charge sampled on the capacitors of the first set between the capacitor of the first set and a capacitor of the second set. Then the voltage on the common node is compared with a comparator reference voltage, so as to receive a comparison result to be used for a bit decision. After the comparison, the floating side of the floating capacitor of the first set of capacitors can be connected to either a first reference voltage or a second reference voltage in accordance with the bit decision.

Accordingly, there is a specific amount of charge which is frozen on the floating capacitor, that is not used during the first bit decision steps. However, as the charge is frozen, it can be used later during the conversion process, although it did not contribute to the conversion process during the first step or during several of the first steps. The charge on the remaining (not floating) capacitor (or capacitors) is used to determine the value of one or more first digits of the digital output word. Preferably, these are the values of the most significant bits of the corresponding digital output word. When the first decisions were made, the corresponding capacitors (e.g., the largest capacitors in the plurality of capacitors) were connected correctly to a specific reference voltage in accordance with the bit values of the first decisions. Once the first decision or decisions were made, the conversion procedure continues with the smaller capacitors according to known successive approximation principles. In particular, the charge on the capacitors that are used for sampling, and which are used during the first decision steps, can undergo charge redistribution with capacitors not used for sampling (i.e., the second set of capacitors). This way, the input voltage can be divided. However, as the floating capacitors hold additional charge, which is only activated during later decision steps, the loss in SNR due to dividing can be reduced. Accordingly, the floating capacitor (or even a plurality of floating capacitors) preferably represents a major part of the capacitance of the plurality of capacitors. Therefore, a specific amount of charge is disabled only during a first or a plurality of first conversion steps. During these steps the input voltage is divided so as to evaluate to which reference voltage level the floating capacitors should be connected in order to remain within the supply voltage level. However, once the decisions are made, the complete charge can be activated. The loss in terms of SNR is therefore substantially reduced compared to the prior art.

The plurality of capacitors can include eight, twelve or sixteen binary weighted capacitors. In this situation, the first set of capacitors can consist of the two most significant (first and second largest) capacitors as well as the fourth most significant (fourth largest) capacitor of the plurality of capacitors. The second set may then include the remaining capacitors. According to this arrangement, the method comprises the step of leaving the two most significant capacitors floating during the first comparison step. This aspect of the invention allows the SNR to be improved by at least 12 dB.

In another aspect of the invention, the input voltage is also sampled on an additional sampling capacitor. The sampling capacitor can have the same capacitance as the combined second set of capacitors. The amount of capacitance, which is advantageously used for sampling, should match the amount of capacitance which is switched between the two reference voltages during conversion. This aspect provides that the overall amount of capacitance used for sampling and conversion is constant. The sampling capacitor is advantageously left floating as long as at least one capacitor of the first set of capacitors is left floating. When the floating capacitors of the first set are tied to one of the reference voltages after the first bit decision or decisions were made, the sampling capacitor will also be tied to a constant voltage level, which can be one of the reference voltages.

Furthermore, the method according to the invention can provide an error correction step after at least one of the floating capacitors has been connected to the first reference voltage or the second reference voltage. In particular, with floating capacitors, there is a risk that parasitic charges are sampled on the capacitors, which can impair the conversion result. Accordingly, a correction step is provided after the first decision or the first decisions during which one or more capacitors of the plurality of capacitors were floating. If any wrong decision has been made during the first decision (or the first decisions), the error correction step allows this error to be identified afterwards. As only the smaller capacitors of the plurality of capacitors are used for the first decisions, an increased noise level has to be taken into account during the first steps. Also, during the first decisions the input voltage level is divided, which decreases the signal-to-noise ratio. However, once the floating capacitors are connected after the first decisions, such that the charge on these capacitors can contribute to the conversion, the errors can be easily identified and the overall signal-to-noise ratio corresponds to one that can only be achieved including the floating capacitors. The gain in SNR is not affected by this correction step.

The invention also provides an analog-to-digital converter for successive approximation. The analog-to-digital converter according to the invention comprises a plurality of capacitors each having a first side coupled to a common node, the plurality of capacitors comprising a first set of capacitors for sampling an input voltage and a second set of capacitors, a plurality of switches, a comparator, and a controlling means adapted to selectively control the switches in order to connect a second side of each capacitor of the plurality of capacitors to a first reference voltage or a second reference voltage and to connect additionally a second side of the first set of capacitors to the input voltage for sampling the input voltage, wherein the controlling means is further adapted to selectively control the switches to leave one side of at least one capacitor of the first set of capacitors floating, to switch a capacitor of the first set of capacitors, which is not floating, with its second side to a first reference voltage or a second reference voltage so as to redistribute the charge sampled on the capacitors of the first set between the capacitor of the first set and a capacitor of the second set, and to perform a comparison of the voltage established on the common node in order to make a bit decision, and to connect the floating capacitor of the first set of capacitors by the floating side to a reference voltage in accordance with the bit decision.

The advantages of an analog-to-digital converter according to the invention over prior art solutions reside in an improved signal-to-noise ratio with an analog-to-digital converter configuration having substantially the same architecture, size and complexity as the prior art analog-to-digital converter. The improvement over the prior art is achieved by leaving at least one capacitor of the plurality of capacitors floating during the first decision. After the first decision was made, the floating capacitor is tied to a reference voltage in accordance with the decision made by use of other, advantageously smaller, capacitors. Each of the capacitors in the plurality of capacitors can have binary weighted capacitance values. There are advantageously at least N binary weighted capacitors, wherein N can, for example, be eight, twelve, sixteen, eighteen, twenty or even more. If there are, for example, sixteen capacitors, the first set of capacitors can include the two most significant capacitors as well as the fourth most significant capacitor of the plurality of capacitors. The second set can comprise the remaining capacitors. The most significant capacitors, i.e. a capacitor of the first set, preferably remain floating during the first comparison step. The controlling means can be adapted to perform an error correction step after at least one of the floating capacitors is connected to the first reference voltage or the second reference voltage. In order to avoid any unwanted disproportion between the capacitance values of the used capacitors, a sampling capacitor can be used for sampling the input voltage, which has the same capacitance value as the combined second set of capacitors, and which is not used for sampling. Advantageously, the sampling capacitor is used similar to a floating capacitor of the first set of capacitors, i.e. the sampling capacitor is also left floating during the first decision step or steps and tied to a DC voltage level at the same time as the floating capacitor.

The invention is beneficial if at least one capacitor (or small amount of capacitance) used for sampling is left floating during a first decision step, however, special embodiments including several floating capacitors (a large amount of floating capacitance) and more than one decision step with floating capacitors can be used to increase the benefits. The invention is not to be understood to be limited to any specific number of floating capacitors or decision steps. Also, the number of capacitors assigned to the first set of capacitors and the second set of capacitors can be any number equal to or greater than one. The additional sampling capacitor can be understood to be part of the first set of capacitors. The invention relates to the general idea of leaving a certain amount of capacitance floating, on which the input signal was sampled during a sampling step. Only after having performed one more bit decision, the floating capacitance is activated to contribute to the conversion.

BRIEF DESCRIPTION OF THE DRAWINGS

Further features and benefits of the invention will be apparent from the following description of example embodiments, with reference to the accompanying drawings, wherein.

DETAILED DESCRIPTION OF EXAMPLE EMBODIMENTS

FIG. 1 shows a simplified block diagram of an SAR ADC according to the prior art. The SAR compares the analog input voltage $V_{in}$ to a fraction of the reference voltage REF, which is generated with a capacitive digital-to-analog converter CDAC. The sampled input voltage $V_{in}$ is first compared to half the reference voltage REF. If the input voltage is higher, it will be compared to three quarters of the reference voltage REF in the next step, otherwise to one quarter. Accordingly, the fraction of the reference voltage REF output by the CDAC converges successively to the analog input voltage $V_{in}$ evaluating one bit per clock cycle. The successive approximation register and interface stage SAR & IF receives the comparison result and provides a corresponding N-bit output to the CDAC. The digital input to the CDAC at the end of the conversion is identical to the digitized input voltage $V_{in}$. The sample-and-hold stage S/H and the capacitor array CDAC can be implemented by use of one capacitor array incorporating all necessary capacitors.

Figure 2A:
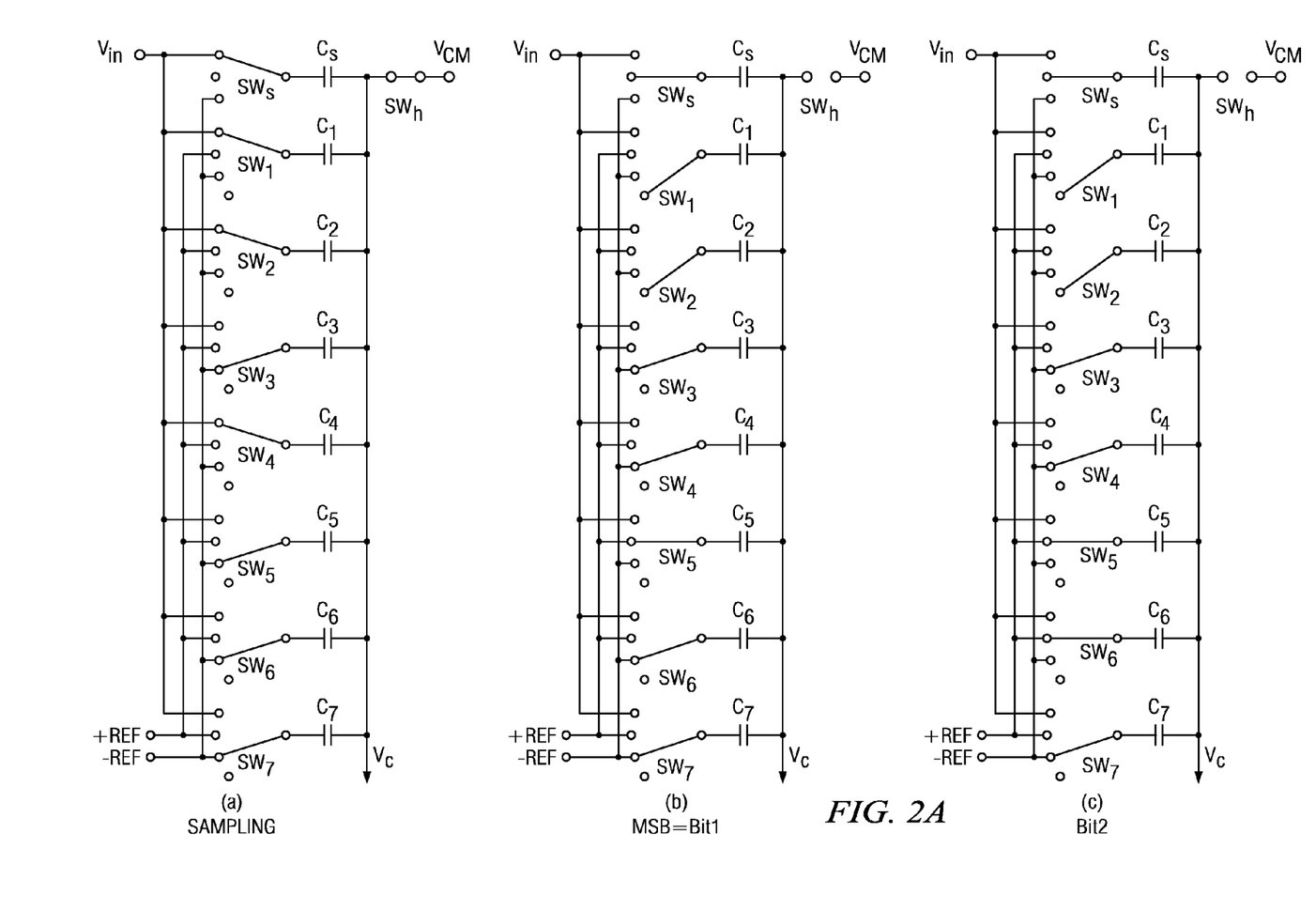
FIGS. 2A and 2B show a series of simplified circuit diagrams of a first embodiment of the invention.
Figure 2B:
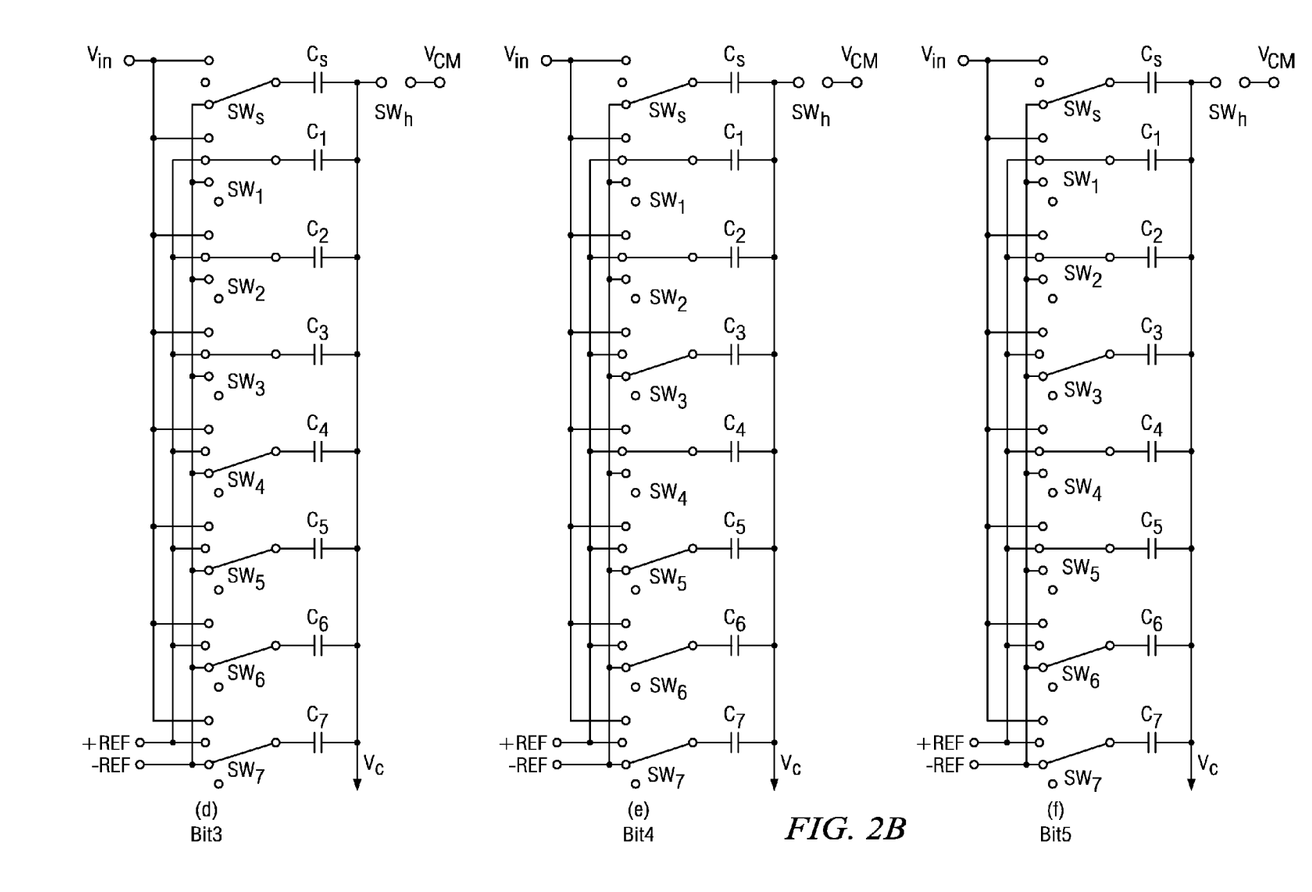

FIGS. 2A and 2B show a series of six simplified circuit diagrams (a)-(f) of a first embodiment of the invention. The plurality of capacitors shown in each figure represents a CDAC for a six-bit ADC. For simplicity of the equations and formulas hereinbelow, seven capacitors $C_1$ to $C_7$ (and an additional sampling capacitor $C_s$) are shown in the figures. However, six capacitors $C_1$ to $C_6$ are sufficient for a six-bit ADC. In order to illustrate the operation of the circuitry according to the invention, FIGS. 2A and 2B show six consecutive steps (a) to (e) of an analog-to-digital conversion. In each figure, the switches $SW_s$, $SW_h$, and $SW_1$ to $SW_7$ are set according to the specific conversion step. As some capacitors of the plurality of capacitors shown in each of the FIGS. 2A and 2B are required to divide the signal down during the MSB decisions, the input voltage can not be sampled on all capacitors. As a consequence, the capacitors are assigned to a first set of capacitors used for sampling and a second set of capacitors not used for sampling. The first set of capacitors includes $C_1$, $C_2$ and $C_4$ as well as the sampling capacitor $C_S$. The second set of capacitors includes $C_3$ and $C_5$ to $C_7$. In the present example, the input voltage $V_{in}$ is set to 7 V. To simplify the example, a +/−10 V reference voltage range is assumed, i.e., +REF=10 V, −REF=−10 V. In this example +REF=−(−REF); however, generally, the magnitudes of the reference levels +REF and −REF are not necessarily equal. The sampling step is shown in FIG. 2A. The amount of capacitance which is used for sampling the input voltage $V_{in}$ is set to match the amount of capacitors used to switch between +/−REF. This prevents generation of a gain error. Therefore, the additional sample capacitor of $C_s$ equals the sum of $C_3$ and $C_5$ though $C_7$. The capacitors $C_1$ through $C_6$ are binary weighted, with $C_1$=C. The last capacitor $C_7$ has the same capacitance as $C_6$. Accordingly, the capacitances are $C_1$=C, $C_2$=C/2, $C_3$=C/4, $C_4$=C/8, $C_5$=C/16, $C_6$=C/32, $C_7$=C/32. The total capacitance is $2C+C_s$. One side of all capacitors is connected to a common side (common node $V_c$) of the capacitors which can be coupled by a switch to a common mode voltage $V_{CM}$. For the present example $V_{CM}$ is assumed to be at 2.5 V, which is necessary to fit into the input voltage range of the comparator between 0 V and 5V. However, for other configurations, a different value for $V_{CM}$ may be used. The common node $V_c$ is connected to an input of a comparator, which performs the comparison steps. The comparator is not shown. As shown at (b) in FIG. 2A, the charge induced on the capacitors by sampling the input voltage is frozen again by opening the hold switch $SW_h$ between $V_C$ and $V_{CM}$. The difference from the arrangements proposed before is that the charge on $C_1$, $C_2$ and $C_S$ is disabled by leaving at least one side of the capacitors floating. As long as one side of the capacitors $C_1$, $C_2$ and $C_S$ of the first set is floating, the charge cannot be redistributed to the other capacitors and the floating capacitors do not contribute to the conversion step. Accordingly, during the conversion steps relating to the two MSBs (MSB and MSB-1), the floating capacitors can be neglected, so that the total charge $Q_{a)}$ contributing to the conversions can be determined as follows:

$$Q_{a)} = C_3(-REF - V_{CM}) + C_4 \cdot (V_{in} - V_{CM}) + \quad (1)$$

$$\sum_{j=5}^{7}(C_j(-REF - V_{CM}))$$

$$= \frac{C}{8} \cdot (V_{in} - 3REF - 4V_{CM})$$

After sampling the input voltage, capacitor $C_4$ is switched from $V_{in}$ to −REF. This has to be compensated for by switching $C_5$ from −REF to +REF. Switches $SW_4$ and $SW_5$ are set accordingly. Taking this into consideration, the charge distribution can be summarized to:

$$Q_{b)} = C_3(-REF - V_C) + C_4 \cdot (-REF - V_C) + \quad (2)$$

$$C_5 \cdot (+REF - V_C) + \ldots \ldots +$$

$$\sum_{j=6}^{7}(C_j(-REF - V_C))$$

$$= \frac{C}{8} \cdot (-3REF - 4V_C)$$

As the total charge contributing in this conversion step is frozen, $Q_{a)}$ is equal to $Q_{b)}$ and the comparator decision $V_c(b)$ can be calculated to be:

$$V_c(b) = V_{CM} - \frac{V_{in}}{4}, \qquad (3)$$

wherein the index (b) relates to view (b) in FIG. 2A, i.e., step (b). $V_c(b)$ is compared with $V_{CM}$ by the comparator. In this step (b), the input voltage $V_{in}$ is divided by a factor of 4. For $V_{CM}=2.5$ V, the voltage on node $V_c$ remains within the supply voltage range, i.e., between 0 V and 5 V. If the comparator detects $V_c(b)>V_{CM}$, it follows that $V_{in}<0$ V; otherwise, $V_{in}>0$ V. Generally, the sign of the result depends also on the sign of the comparator input, to which the common node is coupled. As $V_{in}$ is assumed to be 7 V, the comparator will provide the first result. In the next step (c), which is illustrated in FIG. 2A, the capacitor $C_6$ is switched through $SW_6$ from −REF to REF, and the total charge $Q_{c)}$ amounts then to:

$$Q_{c)} = \sum_{j=3}^{4}(C_j(-REF - V_C)) + \qquad (4)$$
$$\sum_{j=5}^{6}(C_j(+REF - V_C)) + C_7(-REF - V_C)$$
$$= \frac{C}{8} \cdot (-2.5\ REF - 4\ V_C)$$

and, since the charge is still frozen, $Q_{a)}=Q_{b)}=Q_{c)}$, so that the voltage on the common node $V_c$ amounts to:

$$V_c(c) = V_{CM} + \frac{0.5\ REF - V_{in}}{4}, \qquad (5)$$

wherein (c) indicates step (c). $V_c(c)$ is compared with $V_{CM}$. For $V_{in}=7$ V and +REF=10 V, this will give the following result:

$$V_{in} > \frac{REF}{2}. \qquad (6)$$

Accordingly, the two most significant bits MSB and MSB-1 of the digital output word of the converter are set to logic '1'. After having determined the correct result for the two MSBs, all capacitors can be enabled and contribute to the conversion process, because the comparator input $V_c$ converged close enough to $V_{CM}$, so that $V_c$ remains within the supply voltage range.

At this point, it is clear that $C_1$ and $C_2$ must be connected to +REF, and that the first two bits of the corresponding digital output word have the logic value '1'. The further steps can be performed in accordance with a standard SAR algorithm, where each capacitor is switched from −REF to +REF before the next comparison and bit decision is made. $C_s$ is connected to −REF. $C_7$ remains always connected to −REF.

Releasing the floating capacitors adds charge to the conversion process. Therefore, $Q_{a)}$ has to be recalculated considering now also the previously floating capacitors:

$$Q_{a)} = (C_s + C_1 + C_2 + C_4) \cdot (V_{in} - V_{CM}) + \qquad (7)$$
$$(C_3 + C_5 + C_6 + C_7) \cdot (-REF - V_{CM})$$
$$= \frac{C}{8} \cdot (16\ V_{in} - 3\ REF - 19\ V_{CM})$$

The connection scheme for the capacitors after the first three steps can also be explained from a different, and more general angle, starting with the idea that, in the next step shown in FIG. 2B (d), the comparator has to decide, if:

$$V_{in} > \frac{3\ REF}{4}. \qquad (8)$$

This means that $V_c$ in step (d) should amount to:

$$V_c(d) = V_{CM} + \frac{12\ REF - 16\ V_{in}}{19}. \qquad (9)$$

The denominator 19, results from the fact that the total capacitance amounts to $$\frac{19}{8}C$$

(including $C_s$). The weight of the reference voltage has to be ¾ times the weight of the input voltage, which has been sampled on 16 nineteenths of the capacitors. Therefore, ¾ times 16 is to be considered, which is 12. If this equation is solved, so that $Q_{a)}$ is on one side, then the other side of the equation expresses the charge distribution during phase $Q_{d)}$:

$$Q_{d)} = \frac{C}{8}(-19\ V_c(d) + 9\ REF) \qquad (10)$$
$$= \frac{C}{8}(16\ V_{in} - 3\ REF - 19\ V_{CM}) = Q_{a)}$$

$Q_{d)}$ amounts to $$\frac{C}{8}(-19\ V_c(d) + 9\ REF).$$

Again, it must be considered that the CDAC includes in total 19 times C/8. If a times C/8 is connected to +REF and b times C/8 to −REF then:

$$a+b=19 \qquad (11)$$

and $$a-b=9 \qquad (12)$$

This equations can be solved to a=14 and b=5. Accordingly, it could be illustrated that the capacitors $C_1$, $C_2$ and $C_3$ need to be connected to +REF, and capacitors $C_S$, $C_4$, $C_5$, $C_6$, $C_7$ to −REF in order to make the correct decision in this step. From here on, the switching scheme is identical to a typical SAR scheme, where always the next smaller capacitor is toggled from −REF to +REF before the next decision is made. Two of the remaining steps are illustrated at (e) and (f) in FIG. 2B, where $C_4$ and $C_5$ are connected to +REF.

Table 1 shows the decisions and the results in an overview:

TABLE 1

| Decision to be made | Result |
|---|---|
| $V_{in} > 0$ V | '1' |
| $V_{in} > +$REF/2 | '1' |
| $V_{in} > +3$ REF/4 | '0' |
| $V_{in} > +5$ REF/8 | '1' |
| $V_{in} > +11$ REF/16 | '1' |
| $V_{in} > +23$ REF/32 | '0' |

Accordingly, the digital output word is '110110'. A logic '1' indicates that the corresponding capacitor $C_1$ to $C_6$ should be connected to +REF and a logic '0' indicates that the corresponding capacitor is to be connected to −REF through the corresponding switch. So, the switches $SW_1$ to $SW_6$ are to be connected to +REF, +REF, −REF, +REF, +REF, −REF. After the step shown at (f) in FIG. 2B, the last step would consist in connecting $SW_5$ to +REF and $SW_6$ to +REF and to make the last decision. Immediately after the last decision, all the switches would be switched back into the sampling configuration for sampling again the input voltage.

The capacitor array (or CDAC) according to the invention allows, for example, standard 5 V CMOS transistors to be used for the comparator input stage, which improves speed, noise and production costs. As 5 V transistors can be used, the die size and the power consumption decrease dramatically. The method and circuitry according to the invention allows the input voltage to be sampled on most capacitors, while a significant amount of charge (e.g., the major part of the charge) is disabled by leaving some capacitors floating during the bit decisions (e.g., the first MSB decisions). Accordingly, only a fraction of the total charge is used for the conversion of the MSBs. Only when the voltage at the comparator input is low enough to remain within the supply range, then the disabled capacitors are enabled again. However, the input signal (i.e., the corresponding charge) is almost undivided, so that a high signal-to-noise ratio can be achieved.

Since only capacitors $C_3$, and $C_5$ to $C_7$ have not been used for sampling the input voltage is only divided by a factor of 16/19=0.84. This degrades the SNR by 1.5 dB. A prior art architecture would have to divide the input voltage by a factor of about 5, which corresponds to a reduction in SNR of 14 dB. So, the switching scheme according to the invention, improves the SNR by more than 12 dB (i.e., 12.5 dB=14 dB−1.5 dB). A critical decision (i.e., the voltage on the common node is close to the decision threshold of the comparator) can also occur during the MSB conversion, where the input signal is divided. Furthermore, charge injection of the input switches of the floating capacitors adds charge to the common node Vc, which can entail errors. It is therefore important to make an error correction step after enabling all capacitors. This will be explained hereinbelow with respect to FIG. 5.

Figure 3:
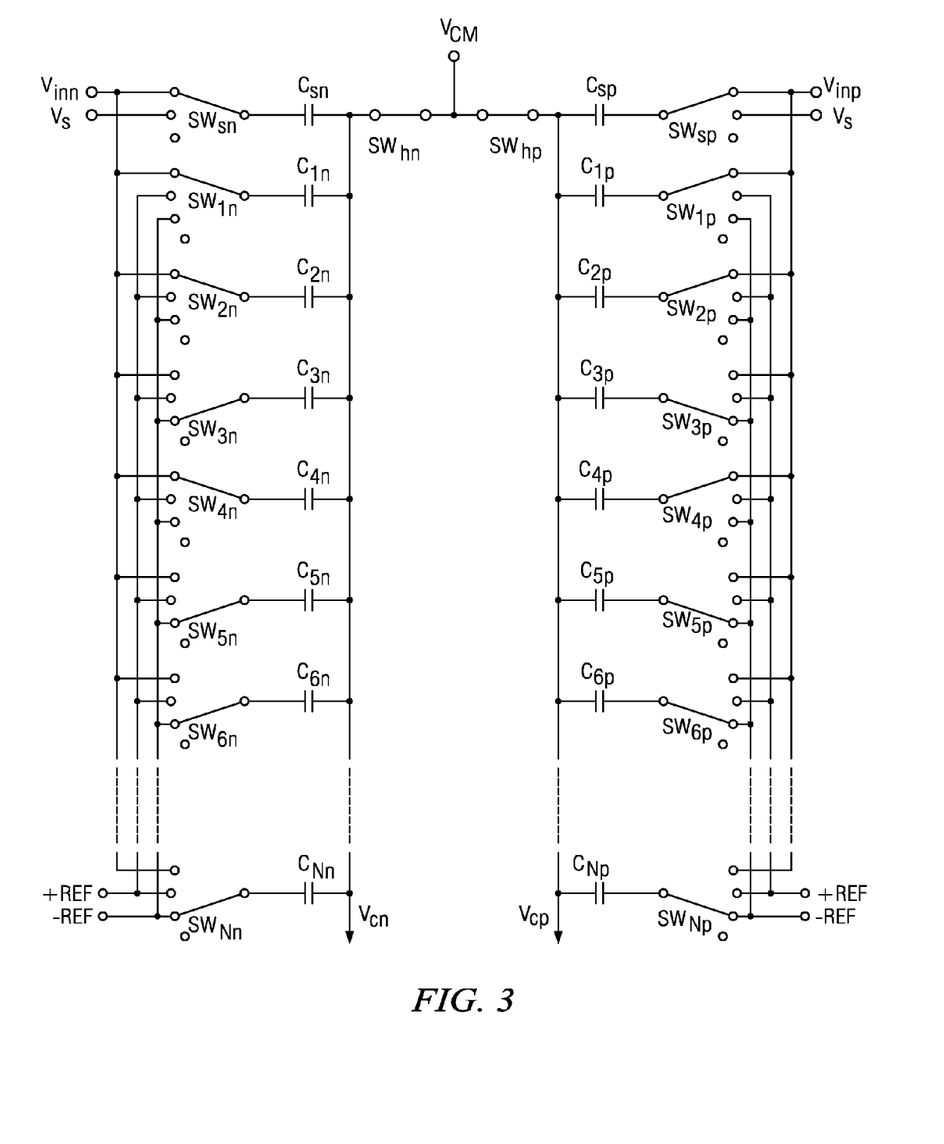
FIG. 3 shows a simplified circuit diagram of a second embodiment of the invention.

The method and circuitry explained with respect to FIG. 2 can be expanded to a fully differential CDAC, so that +/−20 V fully differential signals can be converted. FIG. 3 shows a simplified circuit diagram of a second embodiment of the invention using differential signals. The shown structure relates to an N-bit ADC with a fully differential input voltage range. The circuitry is designed to be fully differential in order to keep the charge injection of the switches SWhp and SWhn symmetrical. This provides a good integral linearity and a reduced offset. The capacitors $C_{1n}$ to $C_{Nn}$ and the capacitors $C_{1p}$ to $C_{Np}$ each constitute an array of capacitors being binary weighted according to the following equation Cjn=C*2−(j−1), where $C_{1n}$ represents the capacitor for the MSB and $C_{Nn}$ represents the capacitor for the LSB. The common side of all capacitors is connected to an internal voltage $V_{CM}$, which sets the operating point of the comparator. The operating point of the comparator is not necessarily equal to $V_{CM}$ but the operating point of the comparator can be defined as function of $V_{CM}$. Therefore $C_{sn}$ and $C_{sp}$ can be connected to a DC voltage $V_s$, which is selected with respect to the required input voltage range of the comparator. Just as an example, VS can be set to 0 V. Once they are set to a specific $V_s$, $C_{sn}$ and $C_{sp}$ operate as a capacitive voltage divider, thereby lifting or lowering the common mode input voltage level.

The input voltage is sampled on capacitors $C_{1p,n}$, $C_{2p,n}$, $C_{4p,n}$ and an additional sampling capacitor $C_{sn,p}$. Accordingly, only three nineteenths of the total capacitance is not used for sampling, which corresponds to the combined capacitance of capacitors $C_{3p,n}$ and $C_{5p,n}$ to $C_{Np,n}$. In response to the hold command, the hold switch freezes the charge at nodes $V_{cp,n}$. In the next step, the input switches $SW_{sn}$, p, $SW_{1n,p}$, $SW_{2n,p}$ and $SW_{4n,p}$ are opened. However, the capacitors $C_{1p,n}$ and $C_{2p,n}$ and $C_{sp,n}$ are not connected to any reference voltage and remain floating. Accordingly, the charge on these capacitors is frozen and cannot contribute to the conversion process of the MSB. Further $C_{4p,n}$ is connected to −REF and $C_{5p,n}$ to REF. The sampled charge that contributes to the conversion in this bit decision step can be calculated as:

$$Q_{sn,p} = \qquad (13)$$

$$C_{4n,p} \cdot (V_{CM} - V_{inp,n}) + C_{3n,p} \cdot (V_{CM} + REF) + \sum_{j=5}^{N} C_{jn,p}(V_{CM} + REF)$$

As the capacitors $C_{4p,n}$ are connected to the negative reference −REF during the next step, the charge during the MSB conversion is equal to $$Q_{MSBp,n} = \sum_{j=3}^{4}(C_{jp,n} \cdot (V_{cp,n} + REF)) + \qquad (14)$$

$$C_{5p,n} \cdot (V_{cp,n} - REF) + + \sum_{j=6}^{N}(C_{jp,n} \cdot (V_{cp,n} + REF))$$

As the total charge on the capacitors used for this decision step is frozen, the charges $Q_{sn,p}$ and $Q_{MSBp,n}$ are equal. Taken into consideration that $C_4=0.5*C_3$, $C_5=0.25*C_3$ and that $C_5$ equals:

$$C_5 \approx \sum_{j=6}^{N} C_j \qquad (15)$$

$V_{cp,n}$ can be calculated as:

$$V_{cp,n} = V_{CM} - \frac{1}{4} \cdot V_{inn,p} \quad (16)$$

As indicated by the last equation (16), the input signal is divided by a factor of four during the evaluation of the MSB. The next bits are evaluated the same way, while the capacitors $C_{1p,n}$ and $C_{2p,n}$ remain floating. For the present embodiment, it can be assumed that $V_{inn}$ is not used as a differential signal input and remains at 0 V all the time. One side of the comparator will therefore always remain at constant voltage level (e.g. $V_{CM}$). The comparator input $V_{cn}$ will converge to the common mode voltage $V_{CM}$ as shown in FIG. 3. In another embodiment $V_{inn}$ can be the complementary signal of $V_{inp}$. For fully differential structures, $C_s$ can also be connected to any DC voltage level. As $C_s$ operates as a capacitive divider, the DC level can be chosen in view of the comparator input range.

FIG. 4 shows a simplified waveform relating to the converging $V_{cn}$ for an example having four bit with $V_{in}=-10$ V where the input signal is only divided by a small factor of $^{16}/_{19}$. Accordingly, the voltage at the input of the comparator is already very limited. When the decision for MSB-3 is made:

$$V_{cn} < V_{CM} + (^{2}/_{19}) \cdot \text{REF} = 3.55\text{V and } V_{cn} > V_{CM} - (^{2}/_{19}) \cdot \text{REF} = 1.45\text{V} \quad (17)$$

Therefore, when the MSB, the MSB-1 and the MSB-2 decisions were made, the maximum comparator input voltage was less than one eighth of the reference voltage away from the common mode voltage, which is chosen to 2.5 V. Now, the total charge on the sampling capacitors can be used to finish the conversion procedure. Capacitors $C_{1pn}$ and $C_{2pn}$ are now connected to either the positive reference voltage +REF or the negative reference voltage −REF in accordance with the decision of the first bit decisions, which were performed with a divided signal amplitude. For an analog-to-digital converter with N=16 according to the invention, an LSB corresponds to a voltage that can be determined by the following equation:

$$1 \text{ LSB} = \frac{C_{1\,pn} + C_{2\,pn} + C_{4\,pn} + C_{sn,p}}{C_{sn,p} + \sum_{j=1}^{N} C_{jp,n}} \cdot \frac{20\text{ V}}{2^N} \quad (18)$$

$$= \frac{16}{19} \cdot 305 \text{ }\mu\text{V}$$

$$= 256 \text{ }\mu\text{V}$$

Therefore, without the invention 1 LSB corresponds to 61 μV. The corresponding voltage step of 1 LSB is increased by a factor of 256/61=4.2 compared to the prior art. With the invention, the SNR is improved by more than 12 dB in a single ended version ($V_{in}=0$V) and in differential mode compared with respective prior art solutions in single ended and differential architecture.

Figure 5:
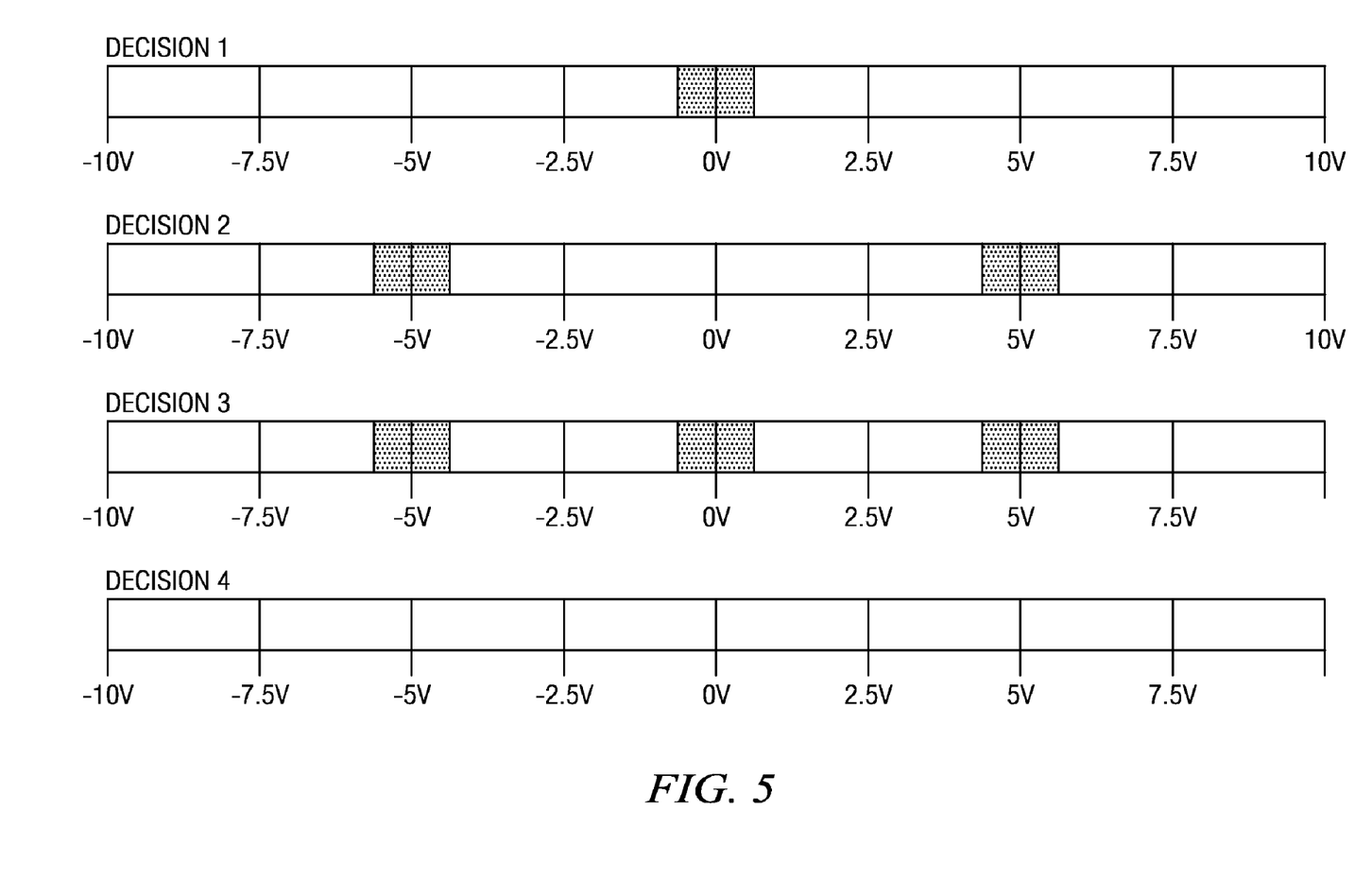
FIG. 5 shows a diagram illustrating the error detection mechanism according to an aspect of the invention.

FIG. 5 shows a diagram relating to the error correction mechanism according to an aspect of the invention. The error correction mechanism can be applied to all embodiments of the invention and relates to an example with two floating capacitors relating to MSB and MSB-1. Generally, each conversion includes two critical decisions where the comparator input is less than half an LSB. The first critical bit decision occurs somewhere during the conversion dependent on the input voltage. The second critical bit decision is the bit N decision, i.e. the last decision. If the first critical decision occurs during the first three decisions, the analog-to-digital converter produces a bit error, as the SNR has not yet benefited from the floating capacitors. For example, in the embodiment shown in FIG. 3 with N=16 the resolution corresponds still to 61 μV per LSB during the two first decisions instead of the 256 μV per LSB according to equation (18). The risk of an erroneous decision is also increased by the charge injection on switches $SW_{1np}$, $SW_{2np}$ and $SW_s$ while $C_{1pn}$, $C_{2pn}$ and $C_S$ are floating. The charge injection can influence $V_{Cn,p}$ by several 100 mV. Accordingly, the prior art error correction mechanism has to be adapted in order to provide more tolerance with respect to errors during the first bit decisions. An example of such a scheme is now explained with reference to FIG. 5. Decisions 1 and 2 are made while capacitors $C_{1pn}$ and $C_{2pn}$ are floating. The possible charge injection errors are indicated by hatched regions around the respective voltage level. For decision 1 this is, for example, 0 V and for decision 2 this is −5 V and 5 V. The first decision tries to catch the MSB and the second decision the MSB-1. After the second decision, the quadrant of the input signal is known with some error. It is now possible to activate all capacitors and stay within the 0 to 5 V window at the comparator input. The third decision relates to MSB-2. As all the capacitors are turned on, the decision is error-free with regard to the floating capacitors. Finally, decision 4 can check if any error occurred during the first two decisions and correct them accordingly. After the fourth decision, the first three bits are error-free and the voltage at the comparator input remains within the allowed range. The conversion can be finished in the standard SAR fashion. Only one additional clock cycle is required.

Those skilled in the art to which the invention relates will appreciate that the described implementations are merely representative examples, and that many other embodiments and variations are possible within the scope of the claimed invention.

What is claimed is:

1. A method for performing a successive approximation analog-to-digital conversion with a first set of capacitors and a second set of capacitors, wherein a first plate of each capacitor from the first and second sets of capacitors is coupled to a common node, the method comprising:

setting a first set of switches so that an input voltage is sampled on each capacitor from the first set of capacitors, wherein each switch from the first set of switches is associated with at least one of the capacitors from the first set of capacitors;

after the step of setting the first set of switches stetting a first switch from the first set of switches so that its associated capacitor is floating;

setting a second switch from the first set of switches so that a second plate of its associated capacitor receives at least one of a first reference voltage and a second reference voltage;

comparing the voltage on the common node with a comparator reference voltage level to receive a comparison result to be used for a bit decision; and setting the first switch from the first set of switches so that its associated capacitor of the first set of capacitors receives at least one of the first reference voltage and the second reference voltage in accordance with the bit decision.

2. The method of claim 1, wherein the first and second sets of capacitors comprises sixteen binary weighted capacitors, and wherein the first set of capacitors further comprises two most significant capacitors and a fourth most significant capacitor, and wherein the second set of capacitors further comprises the remaining capacitors, and wherein the method further comprises allowing the two most significant capacitors floating during the step of comparing.

3. The method of claim 1, wherein the method further comprises sampling the input voltage on an additional sampling capacitor having the same capacitance as the combined total of the second set of capacitors.

4. The method of claim 1, wherein the method further comprises performing an error correction step after the step of setting the first switch from the first set of switches so that its associated capacitor of the first set of capacitors receives at least one of the first reference voltage and the second reference voltage.

5. An analog-to-digital converter for successive approximation, comprising:
   a first set of capacitors, wherein each capacitor from the first set of capacitors has a first plate and a second plate, and wherein the first plate of each capacitor from the first set of capacitors is coupled to a common node;
   a second set of capacitors, wherein each capacitor from the second set of capacitors has a first plate and a second plate, and wherein the first plate of each capacitor from the first set of capacitors is coupled to the common node;
   a first set of switches, wherein each switch is coupled to at least one of the capacitors from the first set of capacitors at its second plate;
   a second set of switches, wherein each switch is coupled to at least one of the capacitors from the second set of capacitors at its second plate;
   a comparator that is coupled to the common node; and
   a controller that is coupled to each of the switches from the first and second sets of switches so as to selectively control the switches, wherein the controller selectively controls the switches so as to leave one side of at least one capacitor of the first set of capacitors floating, to switch a capacitor of the first set of capacitors, which is not floating, to a first reference voltage or a second reference voltage so as to redistribute the charge sampled on the capacitors of the first set between the capacitor of the first set and a capacitor of the second set, and to perform a comparison with the comparator of the voltage established on the common node in order to make a bit decision and connect the floating capacitor of the first set of capacitors to a reference voltage in accordance with the bit decision.

6. The analog-to-digital converter of claim 5, wherein capacitors of the plurality of capacitors have binary weighted capacitance values.

7. The analog-to-digital converter of claim 6, wherein the plurality of capacitors comprises at least sixteen binary weighted capacitors, and wherein the first set of capacitors comprises the two most significant capacitors and a fourth most significant capacitor, and wherein the second set of capacitors comprises the remaining capacitors.

* * * * *